US008567590B2

(12) United States Patent
Scheller et al.

(10) Patent No.: US 8,567,590 B2
(45) Date of Patent: Oct. 29, 2013

(54) METHOD, CLIP AND DEVICE FOR TRANSPORTING AN ARTICLE TO BE TREATED IN AN ELECTROLYTIC SYSTEM

(75) Inventors: Britta Scheller, Atdorf (DE); Rainer Schmidt, Kammerstein (DE); Olaf Lorenz, Atdorf (DE)

(73) Assignee: Atotech Deutschland GmbH, Berlin (DE)

( * ) Notice: Subject to any disclaimer, the term of this patent is extended or adjusted under 35 U.S.C. 154(b) by 660 days.

(21) Appl. No.: 11/920,876

(22) PCT Filed: May 24, 2006

(86) PCT No.: PCT/EP2006/004965
§ 371 (c)(1),
(2), (4) Date: Feb. 12, 2009

(87) PCT Pub. No.: WO2006/125629
PCT Pub. Date: Nov. 30, 2006

(65) Prior Publication Data
US 2009/0178900 A1 Jul. 16, 2009

(30) Foreign Application Priority Data
May 25, 2005 (DE) .......................... 10 2005 024 102

(51) Int. Cl.
B65G 47/34 (2006.01)
B65G 47/92 (2006.01)
(52) U.S. Cl.
CPC ...................................... B65G 47/92 (2013.01)
USPC ................... 198/472.1; 198/476.1; 198/803.9
(58) Field of Classification Search
USPC ........... 198/470.1, 803.3, 803.4, 803.7, 803.9
See application file for complete search history.

(56) References Cited

U.S. PATENT DOCUMENTS 1,564,317 A * 12/1925 Blades ........................ 198/803.9
2,783,869 A * 3/1957 Thurman .................... 198/803.7
4,755,271 A * 7/1988 Hosten ........................... 204/198
(Continued)

FOREIGN PATENT DOCUMENTS

CA 1329792 5/1994
CA 2301315 3/1999
(Continued)

Primary Examiner — William R Harp
(74) Attorney, Agent, or Firm — Edwards Wildman Palmer LLP; Peter F. Corless; Steven M. Jensen

(57) ABSTRACT

The invention relates to the conveyance and preferably also to the electrical contacting of an item to be treated (1), for example in the form of a printed circuit board or a conductor foil, in an electrolysis system. A device according to the invention comprises a large number of clamps (10) able to move along a conveyance path (4) and driven by a continuously revolving drive means (20). The device is configured in such a way that the clamps (10) at the start (4a) of the conveyance path (4) are brought from an open state into a closed state in order to grip and preferably also electrically to contact the item to be treated, and that the clamps (10) respectively at the end (4b) of the conveyance path (4) are brought from the closed into the open state in order to re-release the item to be treated (1). For this purpose, the clamps (10) comprise a first clamping surface (19), arranged on one side of a conveyance plane (2), and a second clamping surface (17), arranged on the opposing side of the conveyance plane (2). The clamps (10) are configured in such a way that both the first clamping surface (19) and the second clamping surface (17) are movable with respect to the conveyance plane (2) in order to open or close the clamp (10).

29 Claims, 6 Drawing Sheets

(56) References Cited

U.S. PATENT DOCUMENTS

| | | | |
|---|---|---|---|
| 4,776,939 A * | 10/1988 | Blasing et al. | 204/202 |
| 4,898,657 A * | 2/1990 | Hosten | 204/198 |
| 5,072,573 A * | 12/1991 | Tisma | 53/252 |
| 5,233,815 A * | 8/1993 | Kroger et al. | 53/540 |
| 5,308,582 A * | 5/1994 | Serra | 422/565 |
| 5,326,442 A | 7/1994 | Schmid | |
| 5,705,043 A | 1/1998 | Zwerner et al. | |
| 5,755,935 A | 5/1998 | Jackson et al. | |
| 5,901,997 A | 5/1999 | Bayer | |
| 5,932,081 A * | 8/1999 | Kopp et al. | 205/137 |
| 6,213,280 B1 * | 4/2001 | Abbadessa et al. | 198/377.02 |
| 6,319,383 B1 * | 11/2001 | Kopp et al. | 205/96 |
| 6,629,403 B1 * | 10/2003 | Tisma | 53/502 |
| 6,942,087 B2 * | 9/2005 | Meyer | 198/427 |

FOREIGN PATENT DOCUMENTS

| | | |
|---|---|---|
| DE | 36 24 481 | 1/1988 |
| DE | 39 39 256 | 5/1991 |
| DE | 195 39 868 | 2/1997 |
| DE | 197 36 352 | 12/1998 |
| DE | 694 13 794 | 6/1999 |
| EP | 0066343 | 12/1982 |
| EP | 0 254 962 | 2/1988 |
| EP | 0 561 184 | 9/1993 |
| JP | 7-509539 | 10/1995 |
| JP | 10-513504 | 12/1998 |
| JP | 11-501992 | 2/1999 |
| JP | 2001-514333 | 9/2001 |
| WO | 91/08326 | 6/1991 |

* cited by examiner

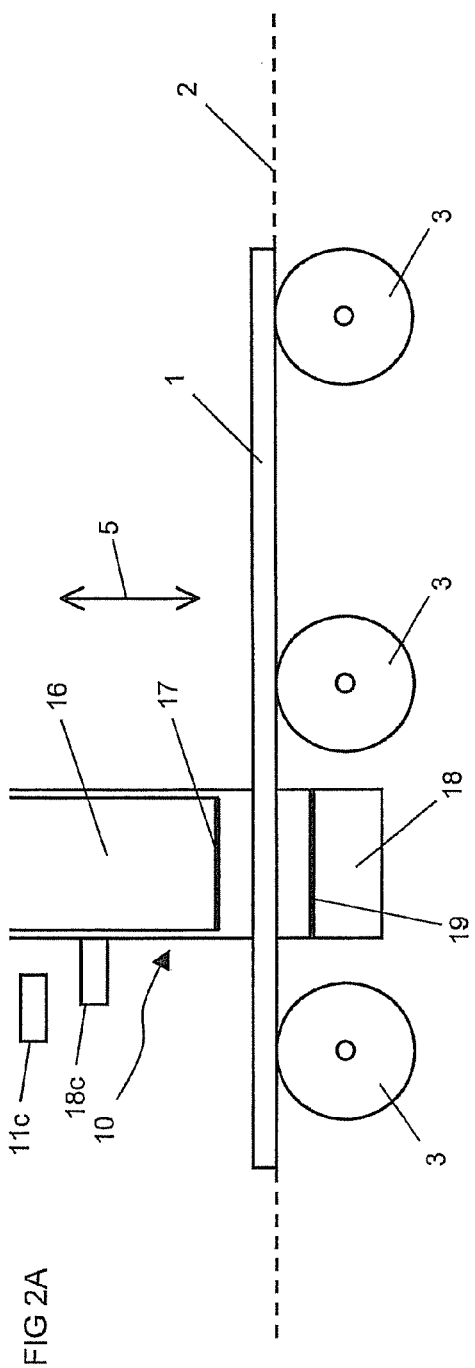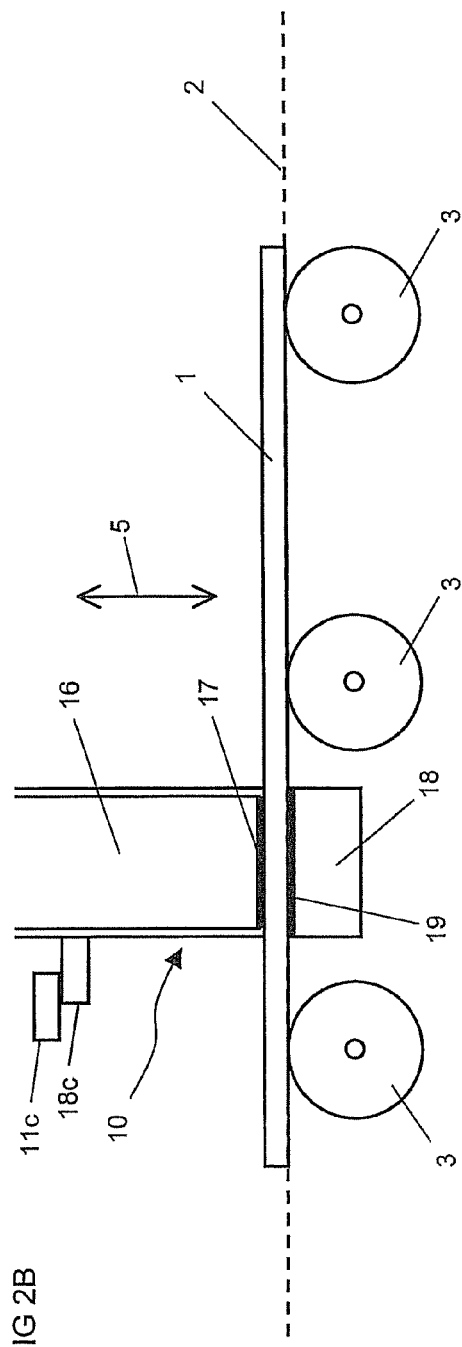

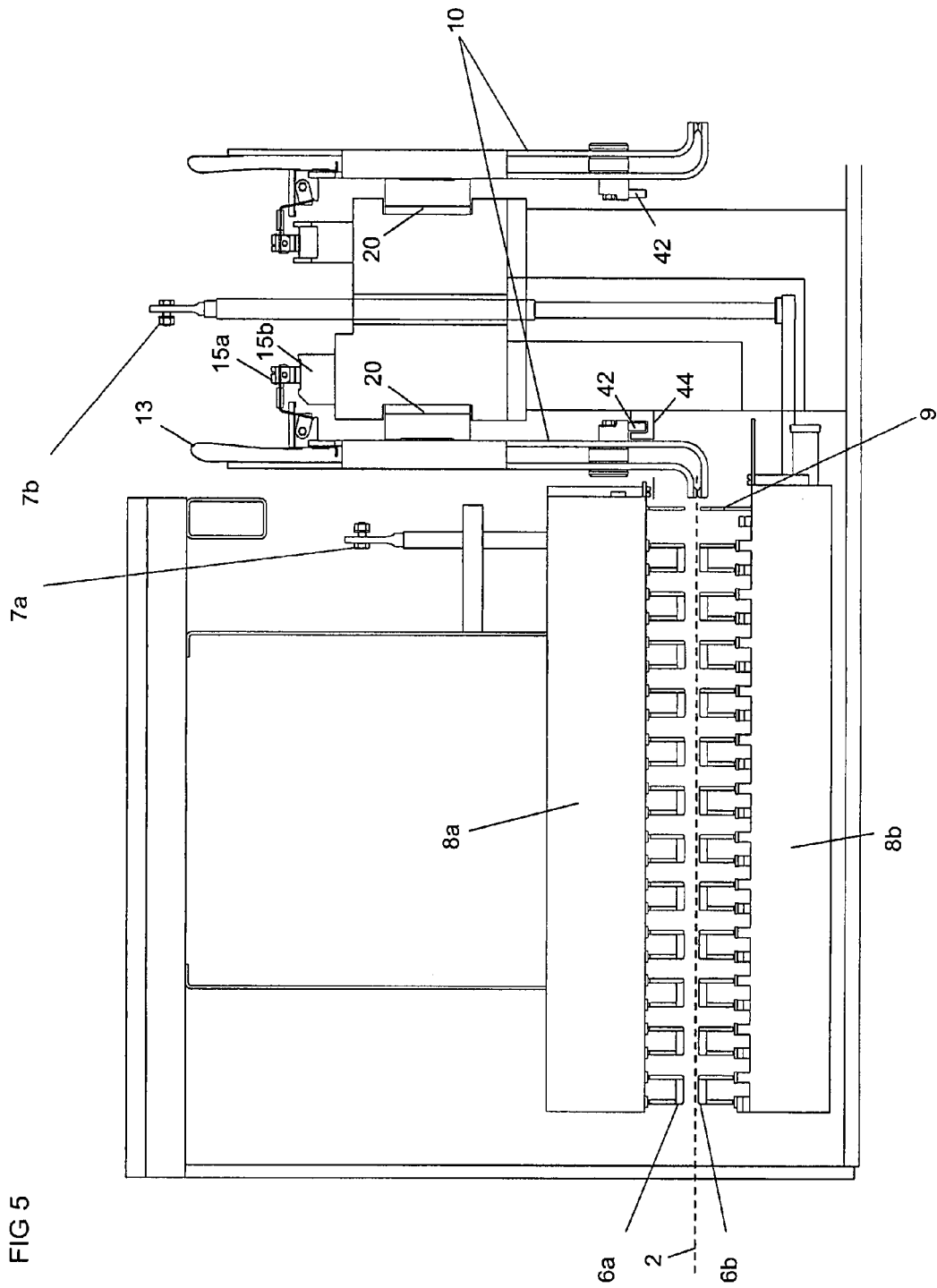

METHOD, CLIP AND DEVICE FOR TRANSPORTING AN ARTICLE TO BE TREATED IN AN ELECTROLYTIC SYSTEM

FIELD OF THE INVENTION

The present invention relates to a method, a clamp and a device for conveying and preferably also electrically contacting an item to be treated, such as, for example, printed circuit boards or conductor foils, in an electrolysis system. In electrolysis systems for electrolytically treating or electroplating an item to be treated, in the form of printed circuit boards or conductor foils, it is conventional, during the treatment, to guide the item to be treated through a bath comprising the electrolytic solution, the item conventionally being conveyed in a horizontal conveyance plane. During the electrolytic treatment, it is necessary to electrically to contact the item to be treated, so a current may be carried from an anode located in the electrolytic solution to the item to be treated, which acts as a cathode, via the electrolytic solution, thus allowing an electrolytic deposition of material, for example copper, on the item to be treated or a removal of material, for example by etching, to be brought about. The conveyance of the item to be treated through the electrolytic solution and the simultaneous electrical contacting, wherein electrical currents of up to $2,000 \, A/m^2$, in peaks of up to $10,000 \, A/m^2$, with respect to the blank surface of the printed circuit board, have to be transmitted, is a considerable technical problem.

BACKGROUND OF THE INVENTION

DE 36 24 481 discloses a device in which conveying of the item to be treated and the electrical contacting accomplished by clamps arranged adjacent to one another in a series on a continuously revolving drive belt. The clamps grip the item to be treated at the start of the conveyance path by being brought from an open state into a closed state, thereby simultaneously producing the required electrical contact to the item to be treated. At the end of the conveyance path, the clamps are respectively brought from the closed into the open state in order to re-release the item to be treated. Conventionally, the item to be treated is conventionally gripped and contacted on the conveyance path by a plurality of adjacent clamps simultaneously.

In this known device for conveying a flat item to be treated, the clamps are configured in such a way that a first clamp half having a first clamping surface is arranged below the conveyance plane so as not to be movable with respect to the conveyance plane. A second clamp half having a second clamping surface is arranged above the conveyance plane and is movable with respect to the conveyance plane. The movement of the second clamp half in the direction of the conveyance plane, in order to bring the clamp into the closed state, is produced by a resilient force. The reverse movement, to bring the clamp from the closed into the open state, takes place counter to the resilient force in that a portion rigidly connected to the second clamp half is guided via a ramp fixed along the conveyance path, thus causing an overall upward movement of the second clamp half and the second clamping surface.

However, in this known arrangement, there are problems with respect to the introduction of the item to be treated between the lower clamping surface and the upper clamping surface. As the lower clamping surface is fixed with respect to the conveyance plane, it is flush with the conveyance plane. In order to prevent the item to be treated from abutting or becoming scratched by an edge of the lower clamping surface during introduction between the lower clamping surface and the upper clamping surface, it is necessary for the item to be treated to be raised out of the conveyance path and then introduced between the lower clamping surface and the upper clamping surface. This may take place, for example, using a ramp arranged in the introduction region. However, this procedure is problematic, in particular in the case of very thin printed circuit boards and conductor foils, as, at the moment of clamping, the item to be treated is not located in the conveyance plane, thus causing stretching, compression or another form of distortion of the item to be treated. In addition, this problem is further intensified by flow effects in the electrolytic solution, as a result of which in particular thin items to be treated are deformed and deflected from the intended conveyance plane, so the deflection caused by the ramp must accordingly be increased in order to allow reliable introduction of the item to be treated between the clamping surfaces.

Owing to the subsequent electrolytic treatment or the deposition of additional material on the item to be treated, deformations are generally no longer reversible, and unacceptable alignment imprecision during subsequent processing steps, and therefore rejection, occurs. Moreover, scratching may occur in the output region of the device, i.e., during opening of the clamp and subsequent forwarding, on the side of the clamp half arranged so as not to be movable with respect to the conveyance plane, i.e. on the lower side of the item to be treated, and this may also result in an increased rejection rate.

WO 99/10568 describes the protection of clamps using a plastics material cover in order to reduce the deposition of material on the clamps.

SUMMARY OF THE INVENTION

In view of the above-described problems, the object of the present invention is to provide a clamp or device for conveying an item to be treated which indicates a movement of the item to be treated out of the conveyance plane and reliably ensures that the item to be treated is not compressed, stretched or otherwise distorted during the electrolytic treatment and the conveyance through the electrolytic solution.

According to the invention, this object is achieved by a method, a clamp and by a device for conveying an item to be treated in an electrolysis system. The dependent claims define preferred and advantageous embodiments of the invention.

The method according to the invention for conveying an item to be treated provides that, for conveying an item to be treated along a conveyance path and in a defined conveyance plane, the item to be treated is gripped at the start of the conveyance path by clamping between a first clamping surface and a second clamping surface, preferably formed on a clamp, whereupon the clamping surfaces are moved along the conveyance path in order to convey the item to be treated and then, at the end of the conveyance path, unclamping takes place in order to re-release the item to be treated.

This allows for the first clamping surface lying in the conveyance plane after gripping the item to be treated and remaining in the conveyance plane until the item to be treated is released. After gripping the item to be treated, the second clamping surface may contact the respective side of the item to be treated with force, irrespective of the thickness of the item to be treated, and then move away from the item so as to release it. As both the first and the second clamping surface are moved toward the conveyance plane for gripping the item to be treated and are moved away from the conveyance plane for re-releasing the item to be treated, the item to be treated is not moved out of the conveyance plane.

In order to ensure unproblematic introduction of the item to be treated between the clamping surfaces and removal or guidance out from the clamping surfaces, it is, in particular, provided that both the first clamping surface and the second clamping surface are moved with respect to the conveyance plane in order to grip or re-release the item to be treated.

Preferably, the item to be treated is also electrically contacted via at least one of the clamping surfaces, a current transmitted via the clamping surface preferably being at least 650 A/m with respect to the length of the board.

The surface pressure with which the clamping surfaces are pressed onto the item to be treated, i.e. the force, exerted onto the item to be treated, with respect to the clamping surface, is preferably from $0.2$ $N/mm^2$ to $3.5$ $N/mm^2$, thus allowing sufficiently low-resistance electrical contacting.

The device according to the invention for conveying an item to be treated in an electrolysis system is configured in such a way that the item to be treated is conveyed along a conveyance path in a defined conveyance plane, the device comprising a large number of clamps which are movably arranged at a distance from one another along the conveyance path. The movement of the clamps along the conveyance path is caused by a drive means preferably configured as a revolving drive means in the form of a drive belt or a drive chain.

The device comprises actuating means which are configured in such a way that at the start of the conveyance path the clamps respectively are brought into a closed state in order to grip the item to be treated and preferably also to electrically contact it during the electrolytic treatment, and that the clamps respectively at the end of the conveyance path are brought into an open state in order to re-release the item to be treated. For this purpose, the clamps respectively comprise a first clamping surface, arranged on one side of the conveyance plane, and a second clamping surface, arranged on the opposing side of the conveyance plane. In order to prevent the item to be treated from abutting the clamp or becoming suspended therefrom during introduction between the first clamping surface and the second clamping surface, it is, according to the invention, provided that both the first clamping surface and the second clamping surface are movable with respect to the conveyance plane in order to bring the clamp for gripping the item to be treated into the closed state or to bring the clamp for releasing the item to be treated into the open state. This means that when the clamp closes, the first clamping surface is moved toward the item to be treated from one side, whereas the second clamping surface is moved toward the item to be treated from the other side. Neither of the two clamping surfaces is therefore in proximity to the conveyance plane when the item to be treated is introduced between the two clamping surfaces, so there is no need to move the item to be treated out of the conveyance plane in order to prevent abutment with lateral surfaces of the clamp during introduction between the clamping surfaces. This has the advantage that the item to be treated is always located completely in the conveyance claim at the moment the clamp closes, thus preventing compression, stretching or another form of distortion of the thin, pliable item to be treated. This advantage is particularly apparent if the item to be treated is gripped by a plurality of the clamps in close proximity to one another in succession.

In order further to reduce deformations of the item to be treated, it is advantageous if, after gripping of the item to be treated, the clamping surfaces do not change their position with respect to the conveyance plane and the clamping surfaces of adjacent clamps do not change their position relative to one another. The device according to the invention and the clamp are therefore configured in such a way, as will be described in greater detail hereinafter, that the forces introduced into the clamp cause as little deflection as possible.

The clamp according to the invention is configured in accordance with the foregoing features. For this purpose, it preferably comprises a first clamp portion with the first clamping surface, a second clamp portion with the second clamping surface and a base portion with an attachment region for attaching the clamp to the drive means, both the first clamp portion and the second clamp portion being movably attached to the base portion. The movable attachment is preferably a displaceable attachment, although a pivotable attachment is also possible.

The clamps are preferably configured in such a way that they are held in the closed state by a resilient force and the clamp is opened counter to the resilient force using the actuating mechanism. This ensures that the force exerted by the clamp onto the item to be treated may be determined by the resilient force and therefore easily and precisely adapted to the requirements. The surface pressure with which the clamping surfaces are pressed against the item to be treated is preferably in the range of from approximately $0.2$ $N/mm^2$ to $3.5$ $N/mm^2$. Moreover, the configuration of the clamp is simplified, since active actuation by the actuating means must take place only for one direction of movement of the clamping surfaces.

Various types of constructions may be provided as actuating means for causing the opening or the closing of the clamp. These may include, for example, a hydraulic drive, a pneumatic drive, an electric drive or a magnetic drive.

Since, as described at the outset, the conveyance plane is uniform over the entire conveyance path, it is advantageous to control the actuating means in such a way that items to be treated having different thicknesses may also be gripped without becoming damaged. This presupposes that even in the case of a constructionally conditioned maximum admissible difference in thickness, one clamping surface does not inadmissibly advance ahead of the other, for example because it has a shorter distance to cover, owing to the thickness of the item to be treated, before it contacts the item to be treated, so that, for example, the upper clamping surface presses onto the item to be treated before the lower one. This would result in one clamping surface pressing the item to be treated out of the conveyance plane before the other clamping surface abuts the item to be treated, wherein the item to be treated would only be returned into the conveyance plane once the clamping surfaces had subsequently been brought together again. It is advantageous, in this connection, to control the movement of the clamping surfaces as a function of the thickness of the item to be treated. A time-advanced movement of the lower clamping surface may thus, for example, be instigated, or the speed of movement of the clamping surfaces may be adapted so that, in the case of thicker items to be treated, the lower clamping surface moves more quickly than the upper clamping surface. If required, the thickness of the item to be treated may be detected via correspondingly configured sensors.

Preferably, the actuating means are configured in such a way that they mechanically couple the movement of the clamps along the conveyance path to the movement of the first clamping surface and the second clamping surface with respect to the conveyance plane. Such a mechanical configuration of the actuating means has the advantage that it may be produced inexpensively and is also reliable and robust with respect to external disturbances. The latter aspect is particularly important in the context of an electrolysis system, in which both chemicals and high electrical currents are used. A simple configuration of the mechanical actuating means might, for example, consist in providing a first clamp half for the first clamping surface and a second clamp half for the second clamping surface, the two clamp halves being driven in such a way that they are moved along the conveyance path with a movement component perpendicularly to the conveyance plane, so that during the movement of the two clamp halves along the conveyance path the clamping surfaces move initially toward the conveyance plane and then away from the conveyance plane.

A further possibility consists in providing along the conveyance path a fixed wedge-shaped element which enters into contact with projections on the first clamp half and the second clamp half, so that the clamp halves are moved relative to the conveyance plane. The clamp halves may, for example, be pressed apart from one another, counter to a resilient force, by the wedge-shaped element. The wedge-shaped element is preferably arranged in such a way that the forces which are introduced in order to actuate the first and second clamp halves substantially compensate one another.

The mechanical actuating means preferably comprise an entrainment wheel, respectively arranged on the clamps, and engagement means, fixed at a predetermined position along the conveyance path, the entrainment wheel and the engagement means being arranged in such a way that the entrainment wheel enters into engagement with the engagement means when the respective clamp passes through the predetermined position, thus causing rotation of the entrainment wheel. Respective conversion means for converting the rotational movement of the entrainment wheel into the movement of the clamping surfaces with respect to the conveyance plane are then preferably provided in the clamps. The use of the entrainment wheel allows a low-wear transmission of force from the movement of the clamps along the conveyance path into the movement of the clamping surfaces with respect to the conveyance plane. The entrainment wheel is preferably arranged in the region of guide means for guiding the movement of the clamp along the conveyance path, so a low degree of leverage is exerted onto the clamp via the entrainment wheel.

The conversion means for converting the rotational movement of the entrainment wheel into the movement of the clamping surfaces with respect to the conveyance plane preferably comprise a rotary disc rotationally coupled to the entrainment wheel and having an outer circumferential surface, of which the radial distance from the axis of rotation of the rotary disc varies along the circumferential direction, i.e. is configured as a cam disc, a first guide portion, movable with the first clamping surface, and/or a second guide portion, movable with the second clamping surface, being respectively held, by a resilient force, in contact with a region of the outer circumferential surface of the rotary disc. The resilient force, as described above, is able simultaneously to provide the force required for moving the clamping surfaces into the closed state. In this configuration of the conversion means, it is possible, on the one hand, for the first and second guide portions to be in contact with the same circumferential surface of the rotary disc. On the other hand, separate circumferential surfaces of the rotary disc, or even two separate rotary discs, each rotationally coupled to the entrainment wheel, may be provided for each of the guide portions. In any case, a compact construction, which converts the rotational movement of the entrainment wheel into the movement of the clamping surfaces with respect to the conveyance plane, is provided. Each of the clamping surfaces may thus be provided with an individual course of motions during gripping and re-releasing of the item to be treated and with a defined holding state between these two operations The rotary disc and the entrainment wheel are preferably arranged in the clamp base portion, which is not movable with respect to the conveyance plane and to which the first and second clamp portions, which are movable with the first clamping surface and the second clamping surface and are rigidly connected to the guide portions, are displaceably attached.

It is also preferred to provide for at least one of the clamping surfaces a stop which limits the movement of the clamping surface in such a way that it may not move beyond the conveyance plane. This prevents the item to be treated from being pressed out of the conveyance plane owing to non-uniformly exerted forces of the first and second clamping surfaces. Moreover, in this case, it is also not necessary for the movement of the first clamping surface and the second clamping surface to take place simultaneously. The clamping process may be brought about with a high degree of reliability in that one of the clamping surfaces is initially brought up to its stop, and therefore up to the conveyance plane, whereupon the other clamping surface is brought up to the item to be treated, in order to clamp said item, from the other side.

The drive means is preferably configured as a continuously revolving drive means, for example in the form of a closed drive belt or a closed drive chain. The clamps are preferably attached to the revolving drive means at a uniform distance from one another. In order to prevent the relative distance between adjacent clamps from varying while the item to be treated is being gripped by these clamps, the drive means is preferably configured in such a way that it prevents displacement of the clamps relative to one another. In this respect, the configuration of the revolving drive means as a drive chain is, for example, advantageous, as in this case the rigid nature of the chain links allows only slight movement of the clamps, fastened to the drive chain, relative to one another. Furthermore, it is also possible to use a strip-shaped drive belt made from a flexible material, a material having high resistance to stretching and compression preferably being used. An embedded reinforcement is preferably provided in the belt-like drive means in order to increase its rigidity and to allow precise guidance of the clamps. When selecting the materials for the drive means, it is advantageous to select materials having low temperature-dependent stretching or shrinkage. In addition, a tensioning mechanism or other tensioning means may be provided in order to minimise relative movement of the clamps. The tensioning means may be configured with a tension force-monitoring means for the drive means, thus allowing disturbances in the revolution of the drive means also to be detected.

If the drive means is strip-shaped, a large attachment surface is available for the clamps, thus preventing tilting of the clamps along the conveyance direction. This is particularly advantageous if the clamps are attached to the drive means outside the conveyance plane, such that a lever arm is formed between the clamping surfaces of the clamp and the region for attachment to the drive means. The arrangement of the drive means outside the conveyance plane has the advantage that, if the conveyance plane extends horizontally, the drive means may be arranged above the liquid level of the electrolysis solution, as a result of which the drive means and the components connected thereto are subject to less stringent requirements in terms of resistance to chemicals.

Attachment portions for attaching the clamps are preferably fastened to the drive means at predetermined intervals, the attachment portions preferably extending over the entire width of the drive means in order to display high resistance with respect to leverage. In this context, it is particularly preferable to provide a quick-release connection between the clamps and the attachment portions. This allows the clamps to be easily detached from or fastened to the drive means for maintenance purposes or in the event of a clamp having to be replaced. In the configuration of the drive means as a drive chain, the attachment portions may also be configured integrally with the chain links.

In order to further to restrict the relative movements of the clamping surfaces of adjacent clamps in the closed state of the clamp, the device preferably comprises, in the region for attachment of the clamps to the revolving drive means, at least one guide groove or guide rail extending parallel to the conveyance path, the attachment portions and/or the clamps respectively having at least one guide element configured to be received, during the movement of the clamp along the conveyance path, in the guide groove. The guide groove restricts movements of the clamping surfaces both in the direction perpendicular to the conveyance path and parallel to the conveyance path, thus preventing deformations of the item to be treated. In this connection, it is particularly advantageous if a respective guide groove is provided on both sides of the revolving drive means, thus providing a pair of guide grooves preferably having opposing recesses for a corresponding guide element on the attachment portions and/or clamps. The recesses in the guide grooves may face one another, such that the guide grooves encompass the attachment portion and/or the clamp from both sides. This allows movement of the clamps perpendicular to the conveyance plane to be restricted in a particularly effective manner. The guidance on both sides also prevents the clamp from tilting about its attachment point.

In particular in the case that the revolving drive means is located outside the conveyance plane, for example above the conveyance plane if the conveyance plane is oriented horizontally, it is preferred that also a guide groove extending substantially in the conveyance plane and along the conveyance path is provided, a respective guide element, configured to be received in this groove during the movement of the clamp along the conveyance path, then being provided on the clamps. Since this guide groove acts on the clamps in proximity to the clamping surfaces, leverage exerted onto the clamps in the region of the clamping surfaces may be particularly effectively counteracted.

In the above-described guide grooves and guide elements of the attachment portions and/or clamps, the guide elements particularly preferably have an elongate shape, i.e. extend over a specific length along the conveyance path, when they are received in the guide groove. Even more effective prevention of tilting of the clamps, with respect to their point of attachment to the revolving drive means, about an axis extending perpendicularly to the conveyance path is thus achieved.

The guide elements particularly preferably extend over a length, the dimensions of which are such that the guide elements of adjacent clamps substantially abut one another in the region of the conveyance path. Firstly, this allows the guidance effect of the guide elements to be optimally utilised. Furthermore, it is achieved that undesirable movement or tilting of adjacent attachment portions and/or clamps I restricted by the respective adjacent guide elements. Compression of the drive means in the region of the clamps located on the conveyance path is also counteracted.

The clamps for supplying the electrical current for the electrolytic treatment also preferably have a respective contact means, for example in the form of a sliding contact or a roller-type contact, which is configured for entering into sliding or rolling contact with a fixed conductor rail. The current contact thus provided is preferably controllable independently of the movement of the clamping surfaces, thus preventing the occurrence of an uncontrolled flow of current or of flashovers when the clamping surfaces approach the item to be treated. This ensures, in particular, that the current flow is activated only once the clamping surfaces have produced a reliable clamping contact to the item to be treated.

In general, the above-described invention therefore allows effective electrolytic treatment, in particular in the case of very thin items to be treated, in the form of conductor foils, without the occurrence of permanent deformations of or damage to the item to be treated. Moreover, the movement on both sides provided according to the invention, of the clamping surfaces with respect to the conveyance plane ensures reliable clamping which is independent of the thickness of the item to be treated.

BRIEF DESCRIPTION OF THE DRAWINGS

The present invention will be described hereinafter in greater detail using a preferred embodiment and with reference to the accompanying drawings, in which:

FIG. 2A and FIG. 2B illustrate schematically the mode of operation of a clamp according to an embodiment of the invention, FIG. 2A illustrating an open state of the clamp and FIG. 2B illustrating a closed state of the clamp;

FIG. 5 is a cross section of an electrolysis system comprising the device for electrically contacting and conveying printed circuit boards or conductor foils as shown in FIGS. 1 to 4.

DETAILED DESCRIPTION OF THE INVENTION

Figure 1:
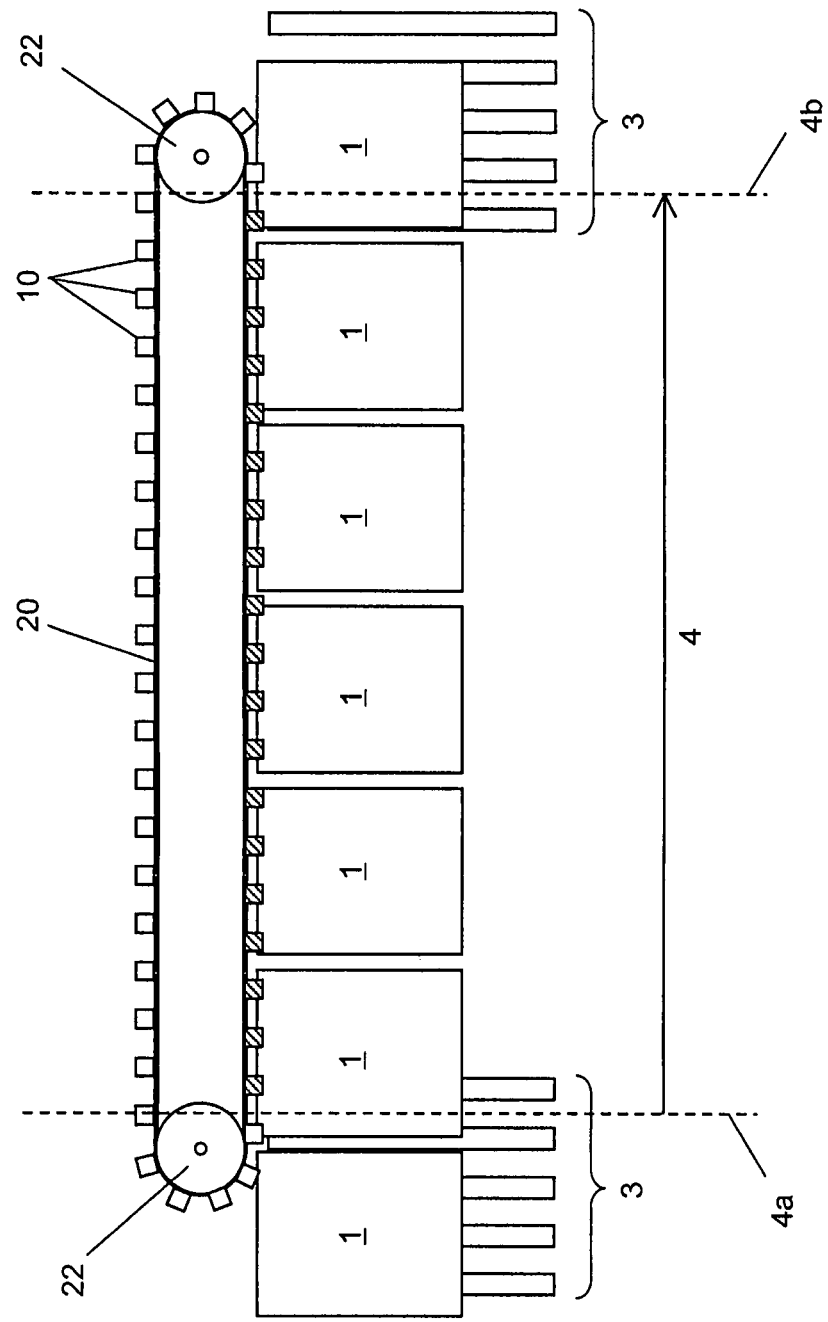
FIG. 1 illustrates schematically the mode of operation of a device for electrolytically contacting and conveying printed circuit boards or conductor foils in an electrolysis system according to a first embodiment of the invention.

FIG. 1 shows schematically a device for electrically contacting and conveying a flat item to be treated 1, for example in the form of thin printed circuit boards or conductor foils. The item to be treated 1 is guided by the device along a conveyance path 4, the conveyance direction being illustrated in the diagram by the direction of the arrow indicating the conveyance path 4. Further conveyance means 3, in the form of rollers or wheels which feed the item to be treated 1 to the device or guide it out from the device, are arranged both at the start 4a and at the end 4b of the conveyance path 4.

The item to be treated 1 is conveyed along the conveyance path 4 by clamps 10 attached to a continuously revolving drive means 20 in the form of a belt or a chain. The revolving drive means 20 is guided around preferably toothed rollers 22 and driven by a motor (not shown).

The clamps 10 are configured in such a way that, at the start of the conveyance path 4a, they are brought from an open state into a closed state, so they grip the item to be treated 1. The gripping of the item to be treated 1 results simultaneously in the electrical contacting of the item to be treated 1, allowing electrolytic treatment of the item to be treated 1 to be carried out during conveyance of the item to be treated 1 over the conveyance path 4. As a result of the electrolytic treatment, a conductive material, for example copper, is deposited on the item to be treated 1. At the end 4b of the conveyance path 4, the clamps 10 are brought from the closed state into the open state in order to re-release the item to be treated 1. In FIG. 1, those clamps located on the conveyance path 4 and therefore being in the closed state are shown hatched.

As may be seen from FIG. 1, the item to be treated 1 is guided along one side of the revolving drive means 20. On the other side of the revolving drive means 20, the clamps 10 are in the open state. This region, in which the clamps 10 return from the end 4b of the conveyance path 4 to the start 4a thereof, is preferably used to remove material deposited during the electrolytic treatment of the item to be treated 1 from the clamps 10.

The further conveyance means 3, configured as rollers or wheels, at the start 4a and end 4b of the conveyance path 4 and also the clamps 10 ensure conveyance, taking place within a defined conveyance plane 2, of the item to be treated 1. In order to ensure that the item to be treated 1 at the start 4a and at the end 4b of the conveyance path 4 is conveyed in the same plane as in the region of the conveyance means 3 configured as rollers, an overlap region is provided between the conveyance means 3 and the conveyance path 4. In addition, sliding guides and/or wheels (not shown), which support the item to be treated 1 during conveyance along the conveyance path 4, so it is held over its entire width in the conveyance plane 2, are provided along the conveyance path 4.

FIG. 1 shows an arrangement in which the item to be treated 1 is gripped by the clamps 10 only on one of its edges. It is, of course, also possible to provide a further drive means 20 comprising clamps 10 in order to grip the item to be treated 1 on its opposing side as well.

FIGS. 2A and 2B illustrate schematically the mode of operation of the clamps 10. The illustration of FIG. 2A corresponds to an open state of the clamp 10 and the illustration of FIG. 2B corresponds to the closed state of the clamp 10. The conveyance plane 2 is illustrated as a broken line in FIGS. 2A and 2B. It will be assumed hereinafter that the conveyance plane 2 extends in a horizontal plane. However, other orientations of the conveyance plane 2, for example a vertical orientation, are also possible. In order to ensure improved guidance of the item to be treated 1 by the conveyance means 3 configured as rollers, rollers may be provided on both sides of the conveyance plane 2. If, as will be assumed hereinafter, the conveyance plane 2 is oriented horizontally, rollers may be provided in the conveyance means 3 merely below the conveyance plane 2. However, an arrangement on both sides is also possible and has advantages for counteracting flow effects.

As illustrated in FIGS. 2A and 2B, the clamp 10 comprises a lower first clamp portion 18 and an upper second clamp portion 16. The lower clamp portion 18 comprises a lower first clamping surface 19 and the upper clamp portion 16 comprises an upper second clamping surface 17. The lower clamping surface 19 is arranged below the conveyance plane 2 and the upper clamping surface 17 is arranged above the conveyance plane 2. Both the upper clamping surface 17 and the lower clamping surface 19 are movable, with respect to the conveyance plane 2, along an indicated clamping direction 5 in order to open or close the clamp 10.

In the open state shown in FIG. 2A, the clamping surfaces 17, 19 are at a predetermined distance from the conveyance plane 2, allowing the item to be treated 1 to be introduced between the clamping surfaces 17, 19 without the item to be treated 1 laterally abutting the clamp portions 16, 18. Since there is sufficient clearance both upwardly and downwardly, it is also not necessary to move the item to be treated 1 out of the conveyance plane 2 in order to ensure reliable introduction of the item to be treated 1 between the clamping surfaces 17, 19. This is the case even with items to be treated 1 having different thicknesses.

As may be seen from FIG. 2B, the clamp 10 is configured in such a way that, in the closed state of the clamp 10, the lower clamping surface 19 is at the level of the conveyance plane 2, i.e. is adjacent thereto, whereas the upper clamping surface 17 is adjacent to the upper side of the item to be treated 1 in order to exert, together with the lower clamping surface 19, a clamping force onto the item to be treated 1. The position, adjacent to the conveyance plane 2, of the lower clamping surface 19 is preferably ensured via a stop 11c which is arranged at a fixed distance with respect to the conveyance plane 2 and limits the upward movement of the lower clamp portion 18 via a stop 18c.

Figure 3:
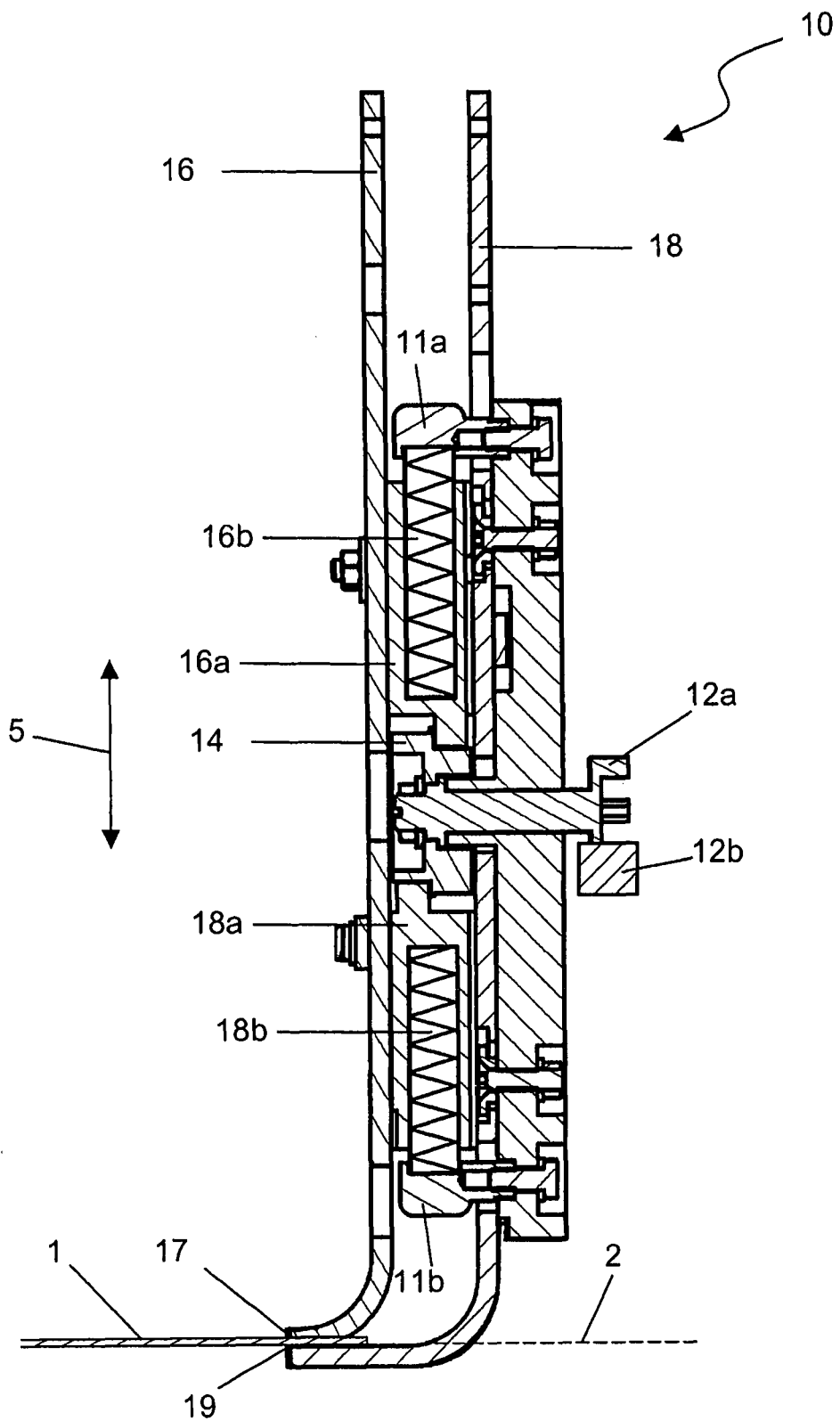
FIG. 3 is a cross section of the clamp according to the embodiment of the invention.

FIG. 3 is a sectional view of the clamp 10, in which the actuating means provided for opening or closing the clamp 10 may, in particular, also be discerned.

The clamp 10 comprises a base portion 11, via which the clamp 10 is fastened to the revolving drive means 20. The base portion 11 is therefore at a fixed distance with respect to the conveyance plane 2. The upper clamp portion 16 and the lower clamp portion 18 are attached to the base portion 11 so as to be displaceable along the clamping direction 5. The upper clamp portion 16 and the lower clamp portion 18 are configured as metal clips respectively comprising a vertical portion, extending along the clamping direction 5, and a horizontal portion, extending parallel to the conveyance plane 2, the horizontal portion being respectively located in the lower region of the clamp portions 16, 18 and the upper clamping surface 17 and the lower clamping surface 19 being configured at the end of the horizontal portion of the clamp portion 16 or 18 respectively. The horizontal portions ensure that the clamping surfaces 17, 19 are arranged at opposing positions with respect to the conveyance plane 2 and may be moved toward one another or away from one another by relative displacement of the clamp portions 16, 18 along the clamping direction 5.

The actuating means comprise an entrainment wheel 12a arranged on the clamp 10 in such a way that, on movement of the clamp 10 along the conveyance path 4, it enters into engagement at specific positions with a rack 12b formed of a plastic material or of a metal and is rotated, as a result of the movement of the clamp 10, by a predetermined amount or angle of rotation. As an alternative to the rack 12b, another engagement means fixed at a specific position of the conveyance path 4, in the simplest case a projection, may also be used. However, the use of the rack 12b, which extends over a specific length along the conveyance path 4, has the advantage that the angle of rotation by which the entrainment wheel 12a is rotated may be adjusted in a precise manner over the length of the rack 12b.

The entrainment wheel 12a is arranged on a common axis of rotation with a rotary disc 14 having, along the axial direction, a first outer circumferential surface portion and a second outer circumferential surface portion. The first outer circumferential surface portion and the second outer circumferential surface portion are respectively at a radial distance, varying along the circumferential direction, from the axis of rotation of the rotary disc 14.

A guide portion 16a, which is rigidly connected to the upper clamp portion 16, is held by a spring 16b in sliding or rolling contact with a region of the first circumferential surface portion of the rotary disc 14. The spring 16b is received in a guide bore in the guide portion 16a and is inserted as a compression spring between the guide portion 16a and a mount portion 11a rigidly connected to the base portion 11.

The spring 16b extends along the clamping direction 5 so, on rotation of the rotary disc 14, the guide portion 16a and with it the clamp portion 16 and the clamping surface 17 are displaced along the clamping direction 5. The displacement of the guide portion 16a is dependent on the radial distance of the region, in contact with the guide portion 16a, of the first outer circumferential surface portion of the rotary disc 14 from the axis of rotation. If this radial distance increases on rotation of the rotary disc, the spring 16b is compressed. If this distance decreases on rotation of the rotary disc 14, the spring is released.

A similar construction is provided for a guide portion 18a, which is rigidly connected to the lower clamp portion 18 and is held by the resilient force of a spring 18b in sliding contact with the second outer circumferential surface portion of the rotary disc 14. The spring 18b is received in a guide bore in the guide portion 18a and is inserted as a compression spring between the guide portion 18a and a lower mount portion 11b rigidly connected to the base portion 11. If, in the region, contacted by the guide portion 18a, of the second outer circumferential surface portion of the rotary disc 14, the radial distance from the axis of rotation increases owing to rotation of the rotary disc 14, the spring 18b is compressed. Conversely, if this distance decreases, the spring 18b is released.

In FIG. 3, the guide portions 16a and 18a are arranged on opposing sides, in the clamping direction 5, of the rotary disc 14, so the guide portion 16a contacts the rotary disc 14 from above, whereas the guide portion 18a contacts the rotary disc from below. The outer circumferential surface of the rotary disc 14 is contacted in different axial outer circumferential surface portions of the rotary disc 14, these axial circumferential surface portions differing in their configuration with respect to the variation in the radial distance of the outer circumferential surface from the axis of rotation. The movement of the guide portions 16a and 18a, and therefore of the clamp portions 16 and 18, may therefore be independently adjusted as a function of the rotational position of the entrainment wheel 12a. However, it is also possible that the rotary disc 14 has merely an axial outer circumferential surface portion with which both guide portions 16a and 18a are in contact. In this case, the construction of the rotary disc 14 is simplified, but the possibilities for independent control of the movement of the clamp portions 16 and 18 are restricted.

As is apparent from FIG. 3 and the foregoing description, in the clamp 10, the upper clamping surface 17 and the lower clamping surface 19 are pressed together, when the clamp 10 closes, by the resilient force of the springs 16b and 18b, whereas when the clamp 10 opens, the clamp portions 16 and 18 move counter to the resilient force of the springs 16b and 18b, so the springs 16b, 18b are compressed. The force with which the clamping surfaces 17, 19 are pressed together is therefore defined by the resilient force of the springs 16b, 18b and may be adjusted via the compression path of the springs 16b, 18b. The clamp 10 therefore allows the force exerted, during the clamping process, onto the item to be treated 1 to be adjusted as required. Preferably, the force with which the clamping surfaces 17, 19 are pressed against each other or onto the item to be treated 1 is approximately 50 N. The surface pressure is between 0.2 N/mm$^2$ and 3.5 N/mm$^2$. It is possible to exert forces of 250 N and greater onto the item to be treated 1 via the clamping surfaces 17, 19, thus ensuring reliable electrical contacting of the item to be treated 1, via which currents of 200 A and greater per clamp may be transmitted. The currents transmitted onto the item to be treated 1 via the clamping surfaces 17, 19 are typically in the region of 20 A. The current with respect to the clamped length of the item to be treated 10 is typically 350 A/m and may in peaks reach up to 7,000 A/m.

The rotary disc 14 is preferably made from a metal in order to ensure high strength. The guide portions 16a, 18a preferably consist, at least in the region in contact with the rotary disc 14, of a plastics material, thus ensuring a low degree of friction, low wear, and electrical insulation.

In order to prevent the item to be treated 1 from becoming stretched, compressed or in any other way distorted or deformed during conveyance by means of the clamps 10, it is necessary to ensure, during the closure process and in the closed state of the clamps 10, minimal relative movement of the clamping regions 17, 19 of adjacent clamps 10. The device for electrically contacting and conveying the item to be treated 1 is therefore configured in such a way that relative movements of the clamps 10 in the closed state are eliminated, regardless of whether these clamps 10 have presently gripped the item to be treated 1 or are empty. Firstly, the construction, described with reference to FIG. 3, for opening and closing the clamp 10 allows, in this regard, a short construction of the clamp, so there is a low degree of leverage acting, with respect to the point for attachment to the drive means 20, on the clamps 10. Moreover, the means for attaching the clamps 10 to the drive means 20 is rigid in its configuration and guide means are provided, reducing undesired movements of the clamps 10 to a minimum. The attachment of the clamps 10 to the drive means 20, and the guide means will be described hereinafter with reference to FIGS. 4A, 4B and 5.

Figure 4A:
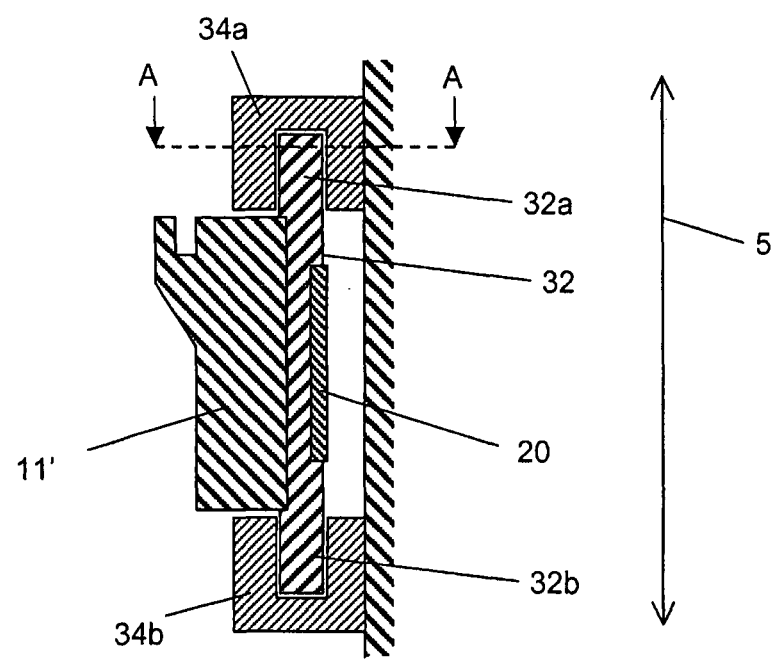
FIG. 4A and FIG. 4B illustrate the attachment of the clamps on a revolving drive means and guide means, provided in the region for attachment of the clamps to the drive means, according to an embodiment of the invention.

FIG. 4A is a sectional view through a region for attachment of the clamp 10 to the revolving drive means 20. For the sake of clarity, the clamp 10 itself has not been shown. Merely a back portion 11' of the clamp, which, in the assembled state, is rigidly connected to the base portion 11 of the clamp 10, is shown.

The clamps 10 may be fastened to the attachment portions 32, for example, by screwing. However, a quick-release connection, e.g. comprising a bayonet mechanism, which allows the clamps 10 easily to be attached and removed, for example to facilitate maintenance work, is preferably provided for this purpose.

As may be seen from FIG. 4A, the revolving drive means 20 extends over a specific width perpendicularly to the conveyance plane 2, i.e. along the clamping direction 5. The revolving drive means is accordingly in the form of a strip or belt or a wide chain and therefore has high resistance to stresses along the clamping direction 5. In the case of a belt, a reinforcement, for example in the form of reinforcement fibres or strips made from metal or another suitable material, which reinforcement is introduced into the flexible material of the belt, is preferably provided. High forces may thus be transmitted onto the clamps, while at the same time ensuring effective chemical resistance, a low degree of friction and low resilience of the drive means 20.

For each of the clamps 10, an attachment portion 32, extending over the entire width of the revolving drive means 20, is fastened to the revolving drive means 20. The attachment portion 32 comprises a recess for receiving the revolving drive means 20, thus increasing the rigidity of the connection between the attachment portion 32 and the drive means 20. The attachment portion 32 may be fastened to the revolving drive means 20, for example, by screwing, adhesion or the like.

The attachment portion 32 has guide elements 32a, 32b on both sides of the revolving drive means 20. The guide element 32a extends upward from the attachment portion 32 and the guide element 32b extends downward from the attachment portion 32. The guide elements 32a, 32b are preferably integral with the attachment portion 32, but may also be rigidly connected thereto. Furthermore, it is also possible to provide the guide elements 32a or 32b as part of the clamp 10 in that they are, for example, connected to the back portion 11' or are integral therewith.

As shown in FIG. 4A, the device has guide grooves 34a and 34b extending parallel to the conveyance path 4. An upper guide groove 34a is arranged above the drive means 20 and is configured to receive the upper guide element 32a. For this purpose, the upper guide groove 34a has a downwardly open, substantially U-shaped cross section. A lower guide groove 34b is provided below the revolving drive means 20 and is configured to receive the lower guide element 32b. For this purpose, the lower guide groove 34b has an upwardly open, substantially U-shaped cross section. The guide grooves 34a and 34b therefore enclose the attachment portion 32 from both sides with the two guide elements 32a, 32b, thus ensuring close guidance of the attachment portion 32 and the clamp 10 attached thereto. This guidance eliminates, in particular, undesired movements of the clamp 10 perpendicularly to the conveyance plane 2 and also tilting of the clamp 10 about its point of attachment to the revolving drive means 20.

Figure 4B:
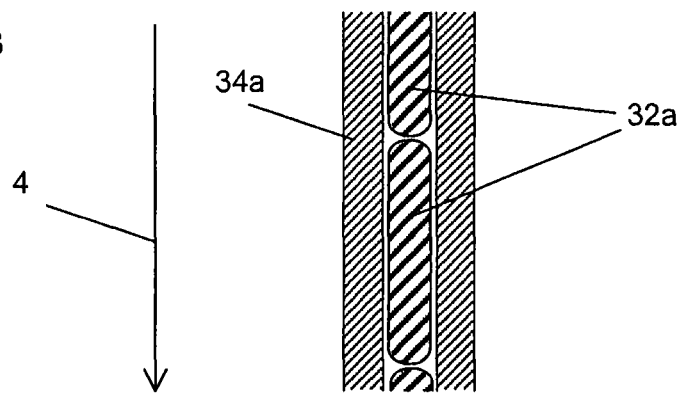

FIG. 4B is a sectional view of the upper guide groove 34a along the line A-A in FIG. 4A. As may be seen from FIG. 4B, the guide elements 32a have an elongate shape. The stability of the attachment of the clamp 10 to the revolving drive means 20 with respect to tilting and twisting is thus increased. As may also be seen from FIG. 4B, the length of the guide elements 32a is of dimensions such that adjacent guide elements 32a substantially abut one another. The lower guide groove 34b and the lower guide elements 32b of the attachment portions 32 are configured in a manner similar to that illustrated in FIG. 4B for the upper guide groove 34a and the upper guide elements 32a. As a result of this abutting arrangement of the guide elements 32a, 32b, the overall rigidity of the revolving drive means 20 is increased. In addition, compression of the revolving drive means 20, which would reduce the relative distance between adjacent clamps 10, may be efficiently eliminated.

The revolving drive means 20 may, for example, consist of a plastics material, whereas the attachment portions 32 are preferably made from metal. In order to ensure effective sliding characteristics of the guide elements 32a, 32b in the guide grooves 34a, 34b, the guide grooves 34a, 34b preferably consist of a plastics material having effective sliding characteristics with respect to the metal of the guide elements 32a, 32b or are lined in their recesses with a plastics material of this type.

FIG. 5 is a simplified sectional view through an electrolysis system comprising the above-described device for electrically contacting and conveying the item to be treated 1.

The electrolysis system has an upper anode arrangement 8a, in an anode chamber, and a lower anode arrangement 8b. Power supply lines for the upper anode arrangement 8a and the lower anode arrangement 8b are denoted by 7a and 7b respectively. For guiding the item to be treated 1 along the conveyance plane 2, upper guide elements 6a and lower guide elements 6b, respectively, which extend from the anode arrangement 8a, 8b in the direction of the conveyance plane 2 and prevent direct contact of the item to be treated 1 with the anode arrangements 8a, 8b, are configured on the upper anode arrangement 8a and the lower anode arrangement 8b. The guide elements 6a, 6b may comprise wheels, rollers, conducting elements or the like.

Moreover, a screen 9 is arranged between the anode chamber and a region through which the clamps 10 are guided. The screen 9 reduces the electrolytic deposition of material on the clamps 10. A further reduction in the deposition of material on the clamps 10 may be achieved in that the clamps 10 are provided with a plastics material cover as described in WO 99/10568.

As may be seen from FIG. 5, the revolving drive means 20 is arranged above the conveyance plane 2 of the item to be treated 1. For the sake of clarity, the attachment of the clamps 10 to the revolving drive means 20 and the configuration of the clamp 10 have not been shown in detail in FIG. 5.

As shown in FIG. 5, a further guide element 42, located substantially at the level of the conveyance plane 2, is attached to the clamps 10. Like the guide elements 32a, 32b, which were described with reference to FIG. 4A and FIG. 4B, the guide element 42 is received, during the movement of the clamp 10 along the conveyance path 4, in a guide groove 44. The guide element 42 and the guide groove 44 ensure particularly effective guidance of the clamp 10, since there is a greater distance with respect to the point for attachment of the clamp 10 to the revolving drive means 20. As was described for the guide elements 32a, 32b and the guide grooves 34a, 34b, the guide element 42 is preferably made from metal, whereas the guide groove 44 consists of a plastics material or is lined with such a material. Since the guide element 42 is located substantially at the same height as the conveyance plane 2 and may therefore be located below the liquid level of the electrolysis solution in the electrolysis system, electrical insulation is preferably provided between the guide element 42 and the clamp 10. Electrolytic deposition of material on the guide element 42 is thus prevented.

FIG. 5 also shows a contact 15a of the clamp 10, which, for supplying a current into the clamp 10, is in sliding or rolling contact with a conductor rail 15b. The contact 15a is preferably held by a resilient force on the conductor rail 15b. The contact 15a is fastened to the lower clamp portion 18 and a flexible line 13 is provided for transmitting the current to the upper clamp portion 16.

A current contact to the clamp 10 is therefore provided by the contact 15a and the fixed conductor rail 15b. The current contact to the clamp 10 is preferably controllable independently of the movement of the clamping surfaces 17, 19 with respect to the conveyance plane 2. It is thus possible not to activate the supply of current to the clamping surfaces 17, 19 of the clamp 10 until the clamp 10 is securely and reliably closed, thus preventing an uncontrolled current flow or flashovers. The current contact may, for example, be controlled mechanically via the sliding contact 15a and the conductor rail 15b.

Figure 6:
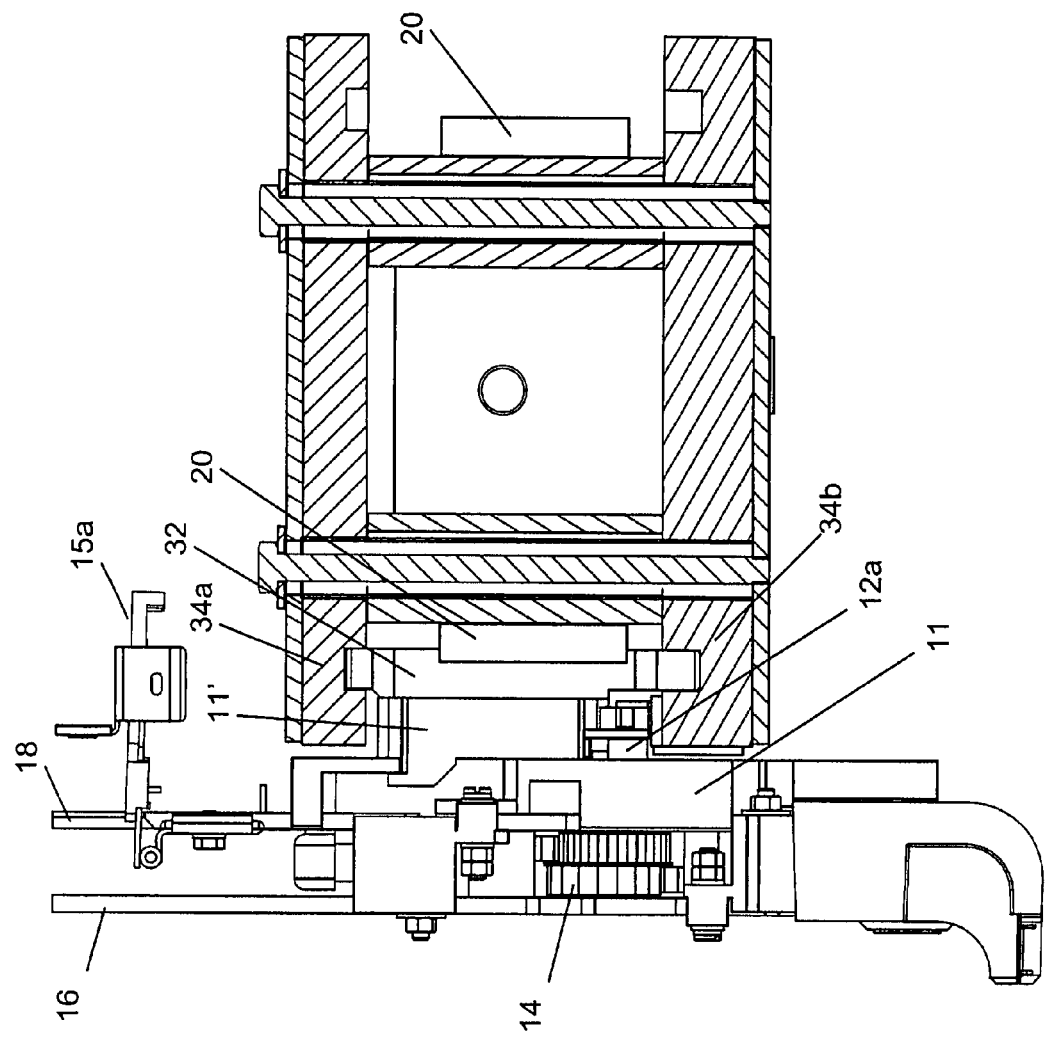
FIG. 6 is an enlarged cross section of the attachment of the clamp in the electrolysis system.

FIG. 6 is an enlarged sectional view of the attachment of the clamp 10 in the electrolysis system. Particularly clear in FIG. 6 is the connection of the base portion 11 of the clamp 10 to the back portion 11' which, for its part, is connected to the drive means 20 via the attachment portion 32. As may also be seen from FIG. 6, the entrainment wheel 12a and the rotary disc 14 of the clamp 10 are arranged in the region of guide means for guiding the movement of the clamp 10. The entrainment wheel 12a is, in particular, located substantially at the same level as the guide groove 34b so, as a result of the engagement of the entrainment wheel 12a with the rack 12d, which is preferably attached to the guide groove 34b, no leverage is exerted onto the clamp 10, or the leverage exerted is absorbed without the clamp 10 tilting.

The above-described device may be modified in various ways. For example, the conveyance plane 2 does not have to be horizontally oriented. Where relative movements between components occur, e.g. between the drive means and a guide groove, corresponding bearings, e.g. slide or roller bearings, may be used to reduce friction. The movement of the lower clamping surface 19 and the upper clamping surface 17 with respect to the conveyance plane 2 may take place simultaneously or in a delayed manner. In addition, alternative actuating means for opening and closing the clamps may also be used. The actuating means may be configured in such a way that they do not derive the energy required for opening and closing the clamp from the clamp drive, i.e. from the movement of the clamp, and comprise for this purpose, for example, a pneumatic drive, a hydraulic drive, an electric drive, a magnetic drive or an alternative mechanical solution. A connecting rod-type connection between the rotary disc 14 and the clamp portion 18 may also be provided, so the spring 18b may be dispensed with. The connecting rod-type connection is, in this case, preferably configured in such a way that the lower clamping surface 19 is brought up to the conveyance plane 2 by rotation of the rotary disc 14, whereas the item to be treated is clamped by means of a resilient force via the upper clamp portion 16. The force required for opening the clamp 10 may thus be reduced, and a stop for limiting the movement of the lower clamping surface 19 is not required.

LIST OF REFERENCE NUMERALS

1 Item to be treated
2 Conveyance plane
3 Conveyance means
4 Conveyance path
4a Start of the conveyance path
4b End of the conveyance path
5 Clamping direction
6a, 6b Guide elements
7a, 7b Power supply line
9 Screen
10 Clamp
11' Base portion
11' Back portion
11a, 11b Mount portion
12a Entrainment wheel
12b Rack
13 Flexible line
14 Rotary disc
15a Contact
15b Conductor rail
16 Upper clamp portion
16a Guide portion
16b Spring
17 Upper clamping surface
18 Lower clamp portion
18a Guide portion
18b Spring
19 Lower clamping surface
20 Drive means
22 Roller
32 Attachment portion
32a, 32b Guide element
34a, 34b Guide groove
42 Guide element
44 Guide groove

The invention claimed is:

1. A method for conveying an item to be treated in an electrolysis system, comprising:
feeding the item to be treated along a conveyance path, the conveyance path having a conveyance plane defined by a bottom surface of the item to be treated;
gripping the item to be treated at the start of the conveyance path by clamping the item to be treated between a first clamping surface and a second clamping surface,
moving the first clamping surface and the second clamping surface along the conveyance path, and
releasing the item to be treated at the end of the conveyance path by unclamping the item to be treated,
wherein the method comprises movement both of the first clamping surface and of the second clamping surface with respect to the conveyance plane in order to grip or release the item to be treated,
wherein, when clamping the item to be treated, one of the clamping surfaces is at the level of the conveyance plane and is adjacent thereto, and
wherein a stop limits movement of only the one clamping surface in a direction of the conveyance plane such that the one clamping surface is stopped at a level of the conveyance plane.

2. A method according to claim 1, wherein the method includes electrical contacting of the item to be treated via at least one of the clamping surfaces.

3. A method according to claim 2, wherein a current is supplied to the item to be treated via the at least one clamping surface.

4. A method according to claim 1, wherein, for clamping the item to be treated, the first clamping surface and the second clamping surface are pressed onto the item to be treated with a force which, with respect to the clamping surface, is between 0.2 N/mm² and 3.5 N/mm².

5. A method according to claim 1, wherein the movement of the first clamping surface and the second clamping surface with respect to the conveyance plane takes place simultaneously.

6. A method according to claim 1, wherein one of the first clamping surface and the second clamping surface is first brought up to the conveyance plane, and the other of the first clamping surface and the second clamping surface is then brought up to the item to be treated.

7. A method according to claim 1, wherein the conveyance plane extends substantially horizontally.

8. A clamp for conveying an item to be treated in an electrolysis system, the item to be treated being fed along a conveyance path, the conveyance path having a conveyance plane defined by a bottom surface of the item to be treated, the clamp being configured to be arranged movably along the conveyance path in order to convey the item to be treated along the conveyance path, the clamp being brought into a closed state at the start of the conveyance path in order to grip the item to be treated and being brought into an open state at the end of the conveyance path in order to release the item to be treated,
the clamp comprising a first clamping surface, arranged on one side of the conveyance plane, and a second clamping surface, arranged on the opposing side of the conveyance plane, and
the clamp being configured in such a way that both the first clamping surface and the second clamping surface are movable with respect to the conveyance plane in order to bring the clamp into the closed state for gripping the item to be treated or to bring the clamp into the open state for releasing the item to be treated,
wherein, in the closed state of the clamp, one of the clamping surfaces is at the level of the conveyance plane and is adjacent thereto, and
wherein the clamp comprises a stop that limits movement of only the one clamping surface in a direction of the conveyance plane such that the one clamping surface is stopped at a level of the conveyance plane.

9. A clamp according to claim 8, wherein the clamp comprises a first clamp portion with the first clamping surface, a second clamp portion with the second clamping surface and a base portion,
the base portion comprising an attachment region for attachment to a drive means, and
both the first clamp portion and the second clamp portion being movably attached to the base portion.

10. A clamp according to claim 8, wherein the clamp is configured in such a way that it is held in the closed state by a resilient force and the clamp is opened counter to the resilient force using an actuating means.

11. A clamp according to claim 8, wherein the clamp comprises an entrainment wheel and conversion means for converting a rotational movement of the entrainment wheel into the movement of the clamping surfaces.

12. A clamp according to claim 11, wherein the conversion means comprise a rotary disc rotationally coupled to the entrainment wheel and having an outer circumferential surface, of which the radial distance from the axis of rotation of the rotary disc varies along the circumferential direction, a first guide portion, movable with the first clamping surface, and/or a second guide portion, movable with the second clamping surface, being respectively held, by a resilient force, in contact with a region of the outer circumferential surface of the rotary disc.

13. A clamp according to claim 11, wherein the clamp comprises guide means for guiding the movement of the clamp along the conveyance path, the entrainment wheel being arranged in the region of the guide means.

14. A clamp according to claim 8, wherein the clamp comprises a contact and a fixed conductor rail, the contact being configured to enter into sliding or rolling contact with the fixed conductor rail in order to provide a current contact for supplying an electrical current to the clamping surfaces.

15. A clamp according to claim 14, wherein the current contact is controllable independently of the movement of the first clamping surface and the second clamping surface.

16. A device for conveying an item to be treated in an electrolysis system, the device comprising:
a conveyance means for feeding the item to be treated along a conveyance path, the conveyance path having a conveyance plane defined by a bottom surface of the item to be treated;
a plurality of clamps which are movably arranged at a distance from one another along the conveyance path,
a drive means for driving the movement of the clamps along the conveyance path, and
actuating means which are configured in such a way that at the start of the conveyance path, in each case, the clamps are brought into a closed state in order to grip the item to be treated at the start of the conveyance path and that at the end of the conveyance path, in each case, the clamps are brought into an open state in order to release the item to be treated,
wherein the clamps comprise a first clamping surface, arranged on one side of the conveyance plane, and a second clamping surface, arranged on the opposing side of the conveyance plane,
wherein the clamps are configured in such a way that both the first clamping surface and the second clamping surface are movable with respect to the conveyance plane in order to bring the clamps into the closed state for gripping the item to be treated or to bring the clamps into the open state for releasing the item to be treated,
wherein, in the closed state of each clamp, one of the clamping surfaces is at the level of the conveyance plane and is adjacent thereto, and
wherein the clamps comprise a stop that limits movement of only the one clamping surface in a direction of the conveyance plane such that the one clamping surface is stopped at a level of the conveyance plane.

17. A device according to claim 16, wherein the actuating means are configured in such a way that they mechanically couple the movement of the clamps along the conveyance path to the movement of the first clamping surface and the second clamping surface with respect to the conveyance plane.

18. A device according to claim 16, wherein the actuating means comprise an entrainment wheel, respectively arranged on the clamps, and engagement means, fixed at a predetermined position along the conveyance path, the entrainment wheel and the engagement means being arranged in such a way that the entrainment wheel enters into engagement with the engagement means when the respective clamp passes through the predetermined position, thus causing rotation of the entrainment wheel.

19. A device according to claim 18, wherein the engagement means comprise a rack extending along the conveyance path over a length, the dimensions of which are such that the entrainment wheel is rotated by a predetermined amount when the clamp passes through the predetermined position.

20. A device according to claim 16, wherein the drive means is configured as a continuously revolving drive means.

21. A device according to claim 20, wherein the revolving drive means is configured as a drive belt made from a flexible material having high resistance to compressive and tensile loads.

22. A device according to claim 21, wherein the drive belt comprises a reinforcement.

23. A device according to claim 21, wherein a quick-release connection is provided between the clamps and the attachment portions.

24. A device according to claim 20, wherein the revolving drive means is configured as a chain.

25. A device according to claim 20, further comprising attachment portions fastened to the revolving drive means for attaching the clamps to the device.

26. A device according to claim 20, wherein the device comprises, in the region for attachment of the clamps to the revolving drive means, at least one guide groove extending parallel to the conveyance path, the attachment portions and/or the clamps respectively having at least one guide element configured to be received, during the movement of the respective clamp along the conveyance path, in the guide groove.

27. A device according to claim 26, wherein the dimensions of the guide elements are such that the guide elements of adjacent clamps substantially abut one another when the clamps are located in the region of the conveyance path.

28. A device according to claim 20, wherein the device comprises, on both sides of the revolving drive means, a respective guide groove extending parallel to the conveyance path, the two guide grooves having opposing recesses for corresponding guide elements which are respectively provided on the attachment portions and/or the clamps and are configured to be received, during the movement of the respective clamp along the conveyance path, in the corresponding recess of the two guide grooves.

29. A device according to claim 16, wherein the device comprises a guide groove extending substantially in the conveyance plane and along the conveyance path, the clamps comprising a respective guide element configured to be received, during the movement of the clamps along the conveyance path, in the guide groove.

* * * * *

UNITED STATES PATENT AND TRADEMARK OFFICE
CERTIFICATE OF CORRECTION

PATENT NO.         : 8,567,590 B2                              Page 1 of 1
APPLICATION NO.    : 11/920876
DATED              : October 29, 2013
INVENTOR(S)        : Britta Scheller et al.

It is certified that error appears in the above-identified patent and that said Letters Patent is hereby corrected as shown below:

Title Page Item (75) Inventors:

The first inventor's city "Atdorf" should read:

--Altdorf--.

The third inventor's city "Atdorf" should read:

--Altdorf--.

Signed and Sealed this
Fourth Day of March, 2014

Michelle K. Lee
*Deputy Director of the United States Patent and Trademark Office*